(12) United States Patent
Telefont

(10) Patent No.: US 7,663,323 B2
(45) Date of Patent: Feb. 16, 2010

(54) MONITORING DEVICE FOR AN ARRAY OF ELECTRICAL UNITS

(75) Inventor: Heinz Telefont, Krems-Egelsee (AT)

(73) Assignee: Alcatel Transport Solution Deutschland GmbH, Stuttgart (DE)

( * ) Notice: Subject to any disclaimer, the term of this patent is extended or adjusted under 35 U.S.C. 154(b) by 461 days.

(21) Appl. No.: 11/583,861

(22) Filed: Oct. 20, 2006

(65) Prior Publication Data

US 2007/0096746 A1   May 3, 2007

(30) Foreign Application Priority Data

Oct. 21, 2005   (EP)   ................................. 05292232

(51) Int. Cl.
*G05F 1/00* (2006.01)

(52) U.S. Cl. ........................ 315/291; 315/312; 315/315; 315/360; 324/605; 324/606; 324/707; 324/713

(58) Field of Classification Search ................. 315/312, 315/315, 316, 360, 362, 291, 307, 200 A, 315/224, 318, 319; 324/605–607, 656, 684, 324/705, 707, 710–713
See application file for complete search history.

(56) References Cited

U.S. PATENT DOCUMENTS

| | | | |
|---|---|---|---|
| 5,955,885 A * | 9/1999 | Kurokami et al. | 324/426 |
| 6,469,523 B2 * | 10/2002 | Sporl et al. | 324/685 |
| 6,870,328 B2 * | 3/2005 | Tanabe et al. | 315/291 |
| 7,130,177 B2 * | 10/2006 | Aizawa et al. | 361/207 |
| 2006/0176411 A1 * | 8/2006 | Furukawa | 349/33 |

FOREIGN PATENT DOCUMENTS

| | | |
|---|---|---|
| DE | 198 41 490 A1 | 3/2000 |
| EP | 0 756 178 A2 | 1/1997 |
| EP | 1 322 139 A1 | 6/2003 |
| EP | 1 371 540 A2 | 12/2003 |

* cited by examiner

*Primary Examiner*—Haissa Philogene
(74) *Attorney, Agent, or Firm*—Sughrue Mion, PLLC

(57) ABSTRACT

A monitoring device for monitoring an array (4) of electrical units, in particular an array of high capacity light emitting diodes (LEDs) (4.1-4.12). The electrical units are connected in series and driven by a constant electric current (I). The monitoring device has a bypass means (4.1a-4.12a) for each electrical unit (4.1-4.12), operable to bypass the respective electrical unit in case of a disconnection of the respective electrical unit, and an evaluation unit (3) connected in parallel with the array (4) of electrical units, said evaluation unit (3) being adapted to determine a total voltage (UT) of the array (4) of electrical units and to output a control signal (CS) indicative of a function status of the array (4) of electrical units in accordance with a value of the total voltage (UT) relative to a predetermined threshold value (VREF). Thus is provided an electric circuitry which allows an easy and reliable detection of a malfunction of the array of electrical units, e.g. due to failure of individual LEDs because of short circuits and/or disconnection, while ensuring a continued operation of the array in case of only minor problems. The monitoring device can advantageously be used in signalling devices, in particular for railway signalling purposes.

10 Claims, 5 Drawing Sheets

MONITORING DEVICE FOR AN ARRAY OF ELECTRICAL UNITS

BACKGROUND OF THE INVENTION

The invention is based on a priority application EP 05292232.5 which is hereby incorporated by reference.

The invention relates to a monitoring device for monitoring an array of electrical units, in particular an array of high capacity light emitting diodes (LEDs), connected in series and driven by a constant electric current.

The invention also relates to a signalling device, comprising an array of lighting units, in particular high capacity light emitting diodes (LEDs), connected in series, and a constant current source coupled to the array of lighting units for driving the lighting units.

Additionally, the invention relates to a use of the above-mentioned signalling device. For railway signalling purposes, conventional signalling lamps (e.g., 12 VAC, 35 W) are being replaced by arrays of high capacity light emitting diodes (LEDs; e.g., 4 V per diode, 350 mA current) in connection with special mirror/lens systems. A major advantage of using LEDs instead of conventional lamps resides in their superior durability which entails an increased cost-effectiveness of operation.

However, in particular when employing LED arrays of the above-mentioned type for signalling purposes, for instance in railway systems, some kind of electric circuitry has to be provided which allows an easy and reliable detection of a malfunction of the LED array, e.g. due to failure of individual LEDs because of short circuits and/or disconnection, while ensuring a continued operation of the LED array in case of only minor problems, e.g. failure of only one diode in an array of twelve.

SUMMARY OF THE INVENTION

It is the object of the invention to provide a monitoring device which can be used to individually monitor a plurality of electrical units connected in series, e.g. high capacity light emitting diodes, for to detect short circuit and/or disconnection faults.

It is further an object of the present invention to provide a signalling device of the above-mentioned type which can be monitored for failure, i.e. short circuit and/or disconnection, of individual lighting units.

It is still another object of the present invention to provide a secure railway signalling device with long durability.

DESCRIPTION OF THE INVENTION

According to a first aspect of the invention the object is achieved by a monitoring device for monitoring an array of electrical units, in particular an array of high capacity light emitting diodes (LEDs), connected in series and driven by a constant electric current, comprising:
  a bypass means for each electrical unit, operable to bypass the respective electrical unit in case of a disconnection of the respective electrical unit, and
  an evaluation unit connected in parallel with the array of electrical units, said evaluation unit being adapted to determine a total voltage of the array of electrical units and to output a control signal indicative of a function status of the array of electrical units in accordance with a value of the total voltage relative to a predetermined threshold value.

According to a second aspect of the invention the object is also achieved by a signalling device, comprising:
  an array of lighting units, in particular high capacity light emitting diodes (LEDs), connected in series,
  a constant current source coupled to the array of lighting units for driving the lighting units, and
  a monitoring device according to said first aspect of the present invention in operative connection with the array of lighting units for monitoring the array of lighting units.

As a general idea the invention makes use of the fact that a failure of individual electrical units connected in series in an array is detectable by means of a reduced total potential/voltage drop across the array, provided that there are means for "mimicking" a short circuit failure of a given electrical unit in the array in case of a disconnection fault, which would otherwise prevent operation of the array of electrical units completely.

In a preferred embodiment of the monitoring device in accordance with the present invention the bypass means comprise a thyristor connected in parallel with the respective electrical unit. Although a thyristor cannot reproduce a "perfect" short circuit, it is easily controllable to provide a difference in voltage drop which can be used for detecting a malfunction of individual electrical units, e.g. LEDs, in said array of electrical units.

Advantageously, the bypass means comprise a first resistor and a second resistor mutually connected in series and connected in parallel with the thyristor, wherein a node of the first and second resistors is coupled to a gate of the thyristor. In this way, by varying the resistance values of the two resistors which effectively function as a voltage divider, the potential drop required to fire the thyristor can be adjusted.

In still another embodiment of the monitoring device in accordance with the present invention the bypass means comprise a capacitor connected in parallel with the second resistor. Thus, an accidental firing of the thyristor in case of parasitic voltage spikes is prevented.

In order to discriminate between failure cases which thoroughly affect a system status, e.g. failure of more than two LEDs in an array of twelve which will lead to an unacceptable drop in luminosity, and cases which do not impair the general operability of the monitored array of electrical units, in a further embodiment of the monitoring device in accordance with the present invention the evaluation unit comprises a differential amplifier adapted to receive as an input voltage the total voltage of the array of electrical units and to generate an output signal indicative of the total voltage of the array of electrical units. Additionally or alternatively, the evaluation unit may comprise a comparator adapted to receive an input signal indicative of the total voltage of the array of electrical units at a first input terminal and a reference signal at a second input terminal and to output a binary output signal for use as said control signal. In this way, by adjusting either the amplification of said differential amplifier and/or a voltage of the reference signal an easy way is provided for to (pre-)define how many of the electrical units in the array of electrical units may fail due to short circuit or disconnection before there is a change in a level (HIGH/LOW) of said binary output signal.

In a further embodiment of the signalling device in accordance with said second aspect of the present invention, said signalling device further comprises a monitoring unit for monitoring the function status of the array in dependence of the control signal. The monitoring unit may be used to forward the current function status of the array to a superior control centre, e.g. for switching off the array of lighting units which is necessary if the general operability is no longer ensured, e.g. due to a major drop in luminosity because of a simultaneous failure of a plurality of lighting units.

In order to enable using the signalling device in accordance with the present invention for railway signalling purposes, according to a further embodiment of the inventive signalling device the latter further comprises a specific mirror/lens system in operative connection with the array of lighting units for bundling, focussing, and directing the electromagnetic radiation produced by the lighting units in said array of lighting units. Correspondingly and according to a third aspect of the invention, the object of the present invention is further achieved by using the aforementioned signalling device as a railway signalling lamp.

Based on the general concept of the present invention, a series connection of an arbitrary number of electrical units to be monitored, e.g. LEDs, can be realised. Furthermore, the proposed circuitry can easily be adapted with respect to the characteristics of different electrical units, e.g. LEDs, as will be appreciated by a person skilled in the art. Compared with a parallel connection of electrical units, the series connection in accordance with the present invention in principle allows an easier failure detection.

Advantageously, the proposed monitoring device and the proposed signalling device—or at least parts thereof—could be realised in integrated form with the electrical units, e.g. LEDs, on a common support material, i.e. as a hybrid integrated circuit (hybrid IC).

Further advantages and characteristics of the present invention can be gathered from the following description of preferred embodiments with reference to the enclosed drawings. The features mentioned above as well as below can be used in accordance with the invention either individually or in conjunction. The embodiments mentioned are not to be understood as an exhaustive enumeration but rather as examples with regard to the underlying concept of the present invention.

BRIEF DESCRIPTION OF THE DRAWINGS

The following detailed description of the invention refers to the accompanying drawings. The same reference numerals may be used in different drawings to identify the same or similar elements.

FIG. 1 is a schematic block diagram of a signalling device 1 for use as a railway signalling lamp in accordance with the present invention. The signalling device 1 comprises a constant current source 2, an evaluation unit 3, and an array 4 of high capacity light emitting diodes (LEDs) connected in parallel by means of a conducting line 5 and respectively coupled to a ground potential GND. The array 4 of LEDs is in operative connection with a mirror/lens system 6 provided for directing and/or focussing the electromagnetic radiation 7, 7' emitted by the individual LEDs (cf. FIGS. 2, 4) in the array 4 for signalling purposes. The conducting line 5 includes a switching means 8 adapted for connecting/disconnecting the array 4 to/from the current source 2, which can be realised as any type of switch controllable by an electric signal, e.g. an electromechanical or micromechanical switch or a transistor, as known to a person skilled in the art.

Figure 1:
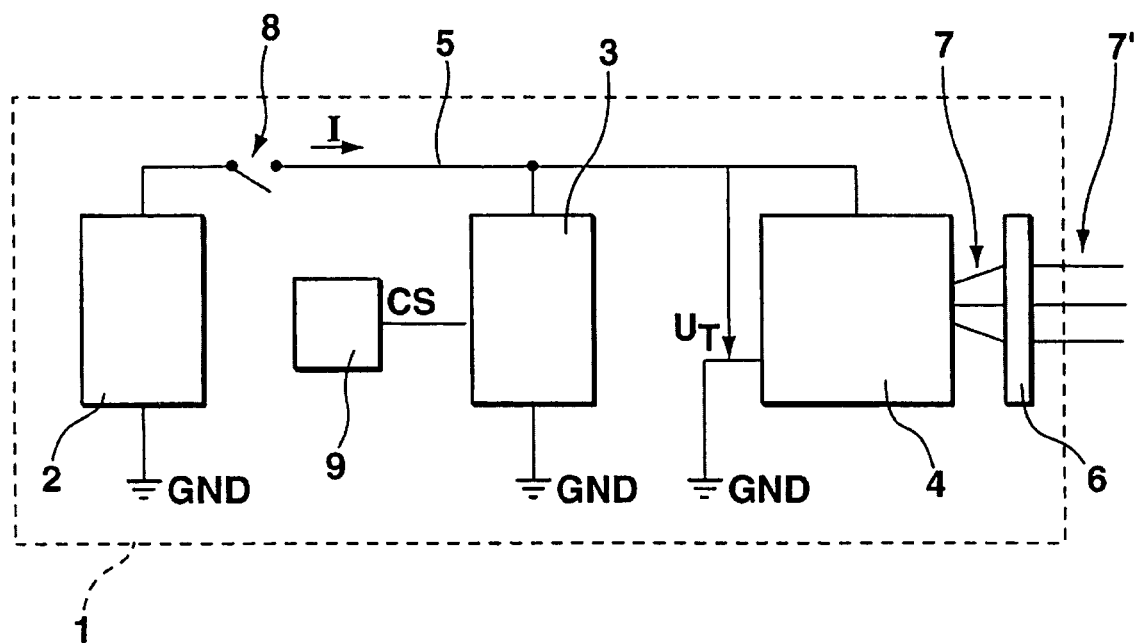
FIG. 1 is a schematic block diagram of a railway signalling lamp in accordance with the present invention.

For illustration purposes, the switching means 8 is depicted in its "open" position in FIG. 1. When the switching means 8 is closed the LED array 4 is driven by a constant electric current I from the current source 2 which produces a total electric potential drop (also referred to as total voltage) $U_T$ across the array 4. The LEDs in the array 4 will then emit electromagnetic radiation 7, which is processed for signalling purposes, i.e. (re-)directed and/or focussed, by means of the mirror/lens system 6. In accordance with the present invention, the evaluation unit 3 evaluates the total voltage $U_T$ and issues a control signal CS to a monitoring unit 9 coupled to the evaluation unit 3. The monitoring unit 9 is used to generate an additional monitoring signal (not shown) for forwarding a current function status of the LED array 4 to a superior control centre (not shown), which may disconnect the LED array 4 from the current source 2, if a value of the total voltage $U_T$ indicates a malfunction of a predetermined number of LEDs in the array 4, as will be appreciated by a person skilled in the art.

Figure 2:
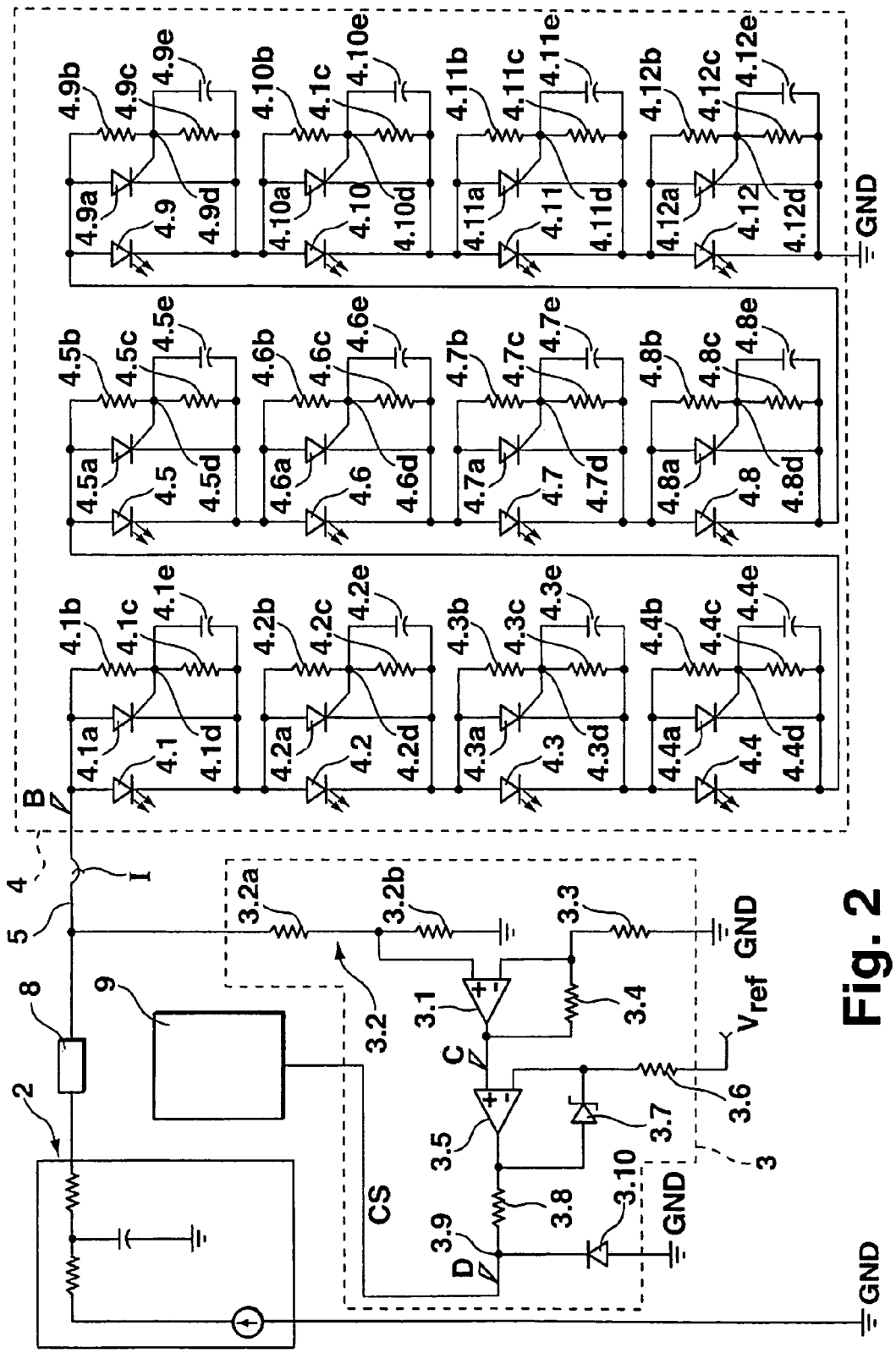
FIG. 2 is a detailed electric circuit diagram of an array of LEDs and a monitoring device in accordance with the present invention.

FIG. 2 shows a detailed electric circuit diagram of an array 4 of LEDs and a monitoring device in accordance with the present invention. The LED array 4 comprises a plurality of high capacity LEDs 4.1-4.12 connected in series, wherein each LED can in general be referred to as an electrical unit. In parallel with each LED 4.1-4.12 there is provided a low-power thyristor 4.1a-4.12a, i.e. a one-gate thyristor triode controllable on the cathode side. In parallel with each thyristor 4.1a-4.12a there are provided respective first and second resistors 4.1b-4.12b and 4.1c-4.12c, respectively, which are mutually coupled in series. A respective node 4.1d-4.12d of each pair of first and second resistors, i.e. a circuit point located between a respective first resistor 4.1b-4.12b and an associated second resistor 4.1c-4.12c, is connected with the gate of the corresponding thyristor 4.1a-4.12a. In parallel with each second resistor 4.1c-4.12c there is connected a capacitor 4.1e-4.12e.

In the shown (simulation) embodiment and without limitation, the first resistors 4.1b-4.12b have been chosen with a resistance value of $R_1=1.5$ kΩ. The second resistors 4.1c-4.12c have a resistance value $R_2=274$Ω. The LEDs 4.1-4.12 each generate a voltage drop $U_1=U_2=\ldots=U_{12}=U_i=1.9$ V, such that $U_T \approx \Sigma U_i$. In practise, the voltage drop per LED 4.1-4.12 depends on the colour of the LED and typically ranges from 2.2 V to 4 V. The capacitors 4.1e-4.12e have a capacity $C=0.1$ μF.

The evaluation unit 3 of the monitoring device is connected in parallel with the LED array 4 described in detail above. The evaluation unit 3 comprises a first amplifier 3.1, the non-inverting input terminal (+) of which is coupled to the conducting line 5 (cf. FIG. 1) via a voltage divider 3.2 comprising resistors 3.2a (100 kΩ) and 3.2b (10 kΩ), respectively. The inverting input terminal (−) of the amplifier 3.1 is grounded GND via a resistor 3.3 (22.1 kΩ). The output terminal of the first amplifier 3.1 is coupled with the inverting input terminal (−) via a further resistor 3.4 (100 kΩ). In this way, the amplifier 3.1 is adapted to function as a differential amplifier, which provides at its output terminal an output signal indicative of the total voltage $U_T$ across the LED array 4. Besides said first amplifier 3.1 the evaluation unit further comprises a second amplifier 3.5 the non-inverting input terminal (+) of which is connected with the output terminal of the first amplifier 3.1 to receive said output signal therefrom. The inverting input terminal (−) of the second amplifier 3.5 is connected with a reference potential $V_{REF}$ (=11.5 V) via a resistor 3.6 (1 kΩ). The output terminal of the second amplifier 3.5 is coupled with the inverting input terminal (−) via a Zener diode 3.7. Furthermore, the output terminal of the second amplifier 3.5 is coupled with a resistor 3.8 (1 kΩ), and a node 3.9 downstream of said resistor 3.8 is grounded via a diode 3.10. Furthermore, via the resistor 3.8 the output terminal of the second amplifier 3.5 is connected with the control unit 9 (cf. FIG. 1). Thus, the second amplifier 3.5 functions as a comparator for to compare the output signal of the differential amplifier 3.1 (indicative of the total voltage $U_T$ across the LED array 4) with the reference voltage $V_{REF}$, generating at its output terminal a binary output signal, i.e., if the voltage associated with the output signal of the first amplifier 3.1 exceeds the reference voltage $V_{REF}$ the binary output signal will be HIGH. Otherwise the binary output signal of the second amplifier 3.5 will be LOW. The binary output signal is used as control signal CS for the monitoring unit 9.

In the embodiment of FIG. 2, the constant current source 2 is adapted to deliver a constant current I=350 mA. The resistor-capacitor network comprised inside the box-shaped form of the current source 2 is needed for simulation purposes only, as will be appreciated by a person skilled in the art, and will not be dealt with in the present description.

The operation of the electric circuit depicted in FIG. 2 will now be explained with reference to appended FIG. 3.

Figure 3:
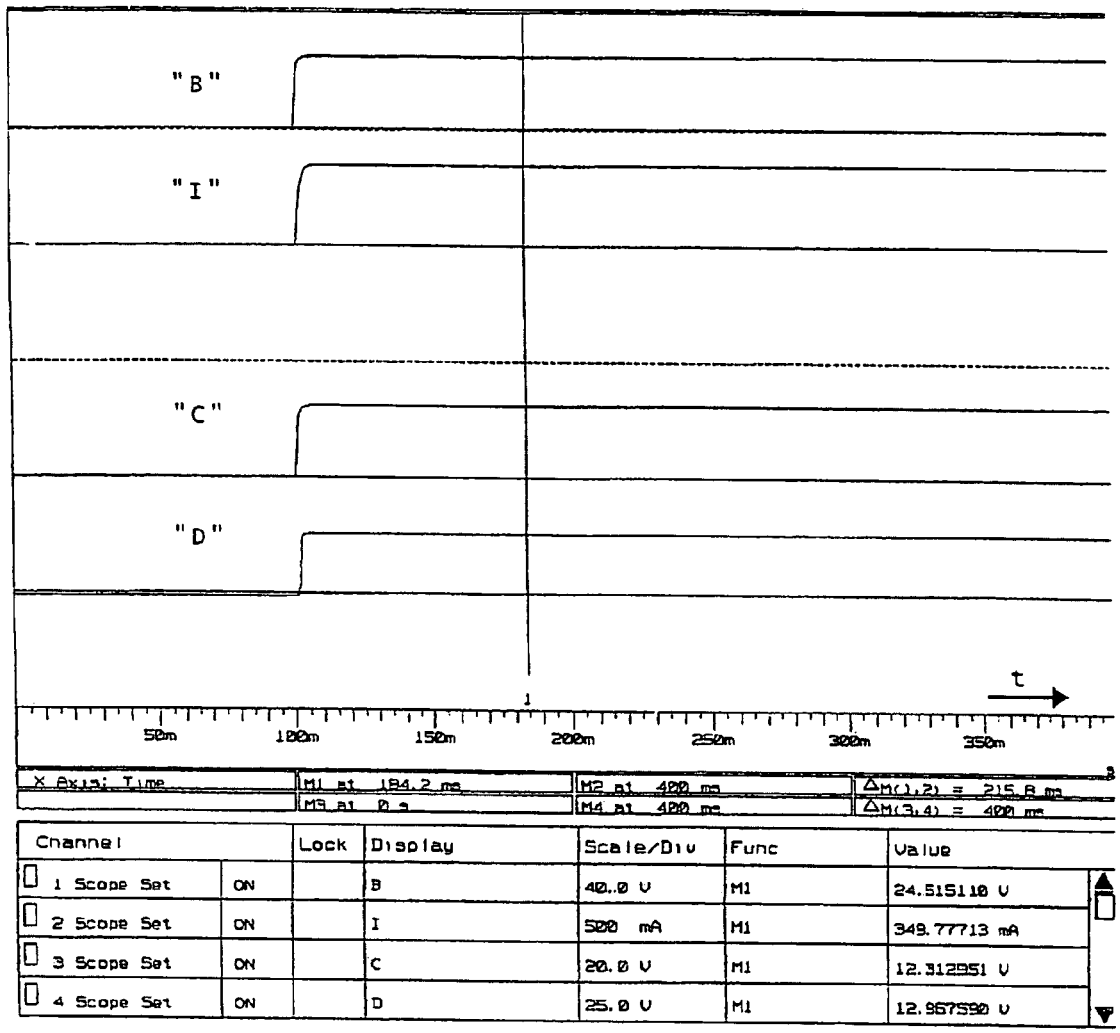
FIG. 3 is a diagram showing voltage and current values measured at different points of the circuit according to FIG. 2.

FIG. 3 shows voltage and current values measured at different points of the circuit according to FIG. 2, i.e. at points denoted B, I, C, and D in FIG. 2, as a function of time t (in milliseconds). The voltage at point B is displayed in the top panel marked "B" of FIG. 3. In the second panel of FIG. 3 (marked "I") there is displayed the current as measured at point I. The voltage at the non-inverting terminal (+) of the second amplifier 3.5 as measured in point C is depicted in the third panel of FIG. 3 (marked "C"), and the binary output signal of the second amplifier 3.5 as measured at point D is plotted in the fourth panel (marked "D") of FIG. 3. At t≈100 ms, the switch 8 is operated to connect the constant current source 2 and the LED array 4, i.e. a constant current≈350 mA flows through each of the diodes 4.1-4.12, which accordingly emit radiation 7 (cf. FIG. 1). Since all of the diodes 4.1-4.12 are functioning correctly, the total voltage across the LED array 4 (point B) essentially corresponds to the cumulative voltage drops at the diodes 4.1-4.12. Thus, the signal as measured at point C exceeds the reference voltage $V_{REF}$, and the binary output signal of the comparator 3.5 is HIGH, indicating a correct functioning of the LED array 4.

On the contrary, if there was a short circuit at at least one of the LEDs 4.1-4.12 (cf. FIG. 2) then there would result a reduced voltage $U_T$ across the array 4, i.e. at point B, and accordingly at point C. By adapting an amplification of the first amplifier 3.1 and/or the reference voltage $V_{REF}$, a threshold value of the total voltage $U_T$ across the LED array at which the output value of the comparator 3.5 switches from HIGH to LOW (or vice versa) can be controlled, as will be appreciated by a person skilled in the art. In the embodiment of FIG. 2, simultaneous short circuits at three of the LEDs 4.1-4.12 will result in a LOW level output signal at the output terminal of the second amplifier 3.5 which is used as a control signal CS to the monitoring unit 9 forwarding it to a control centre, as described above. In this way, the LED array 4, i.e. the signalling device 1 (cf. FIG. 1), can be effectively turned off in case of a failure of a predetermined number of LEDs in the array 4. On the other hand, since a failure of up to two LEDs in the array 4 does not impair the functioning of the signalling device 1 (FIG. 1) in terms of total luminosity, etc., in this case the evaluation unit 3 will continue to provide a HIGH level binary output signal.

Figure 4:
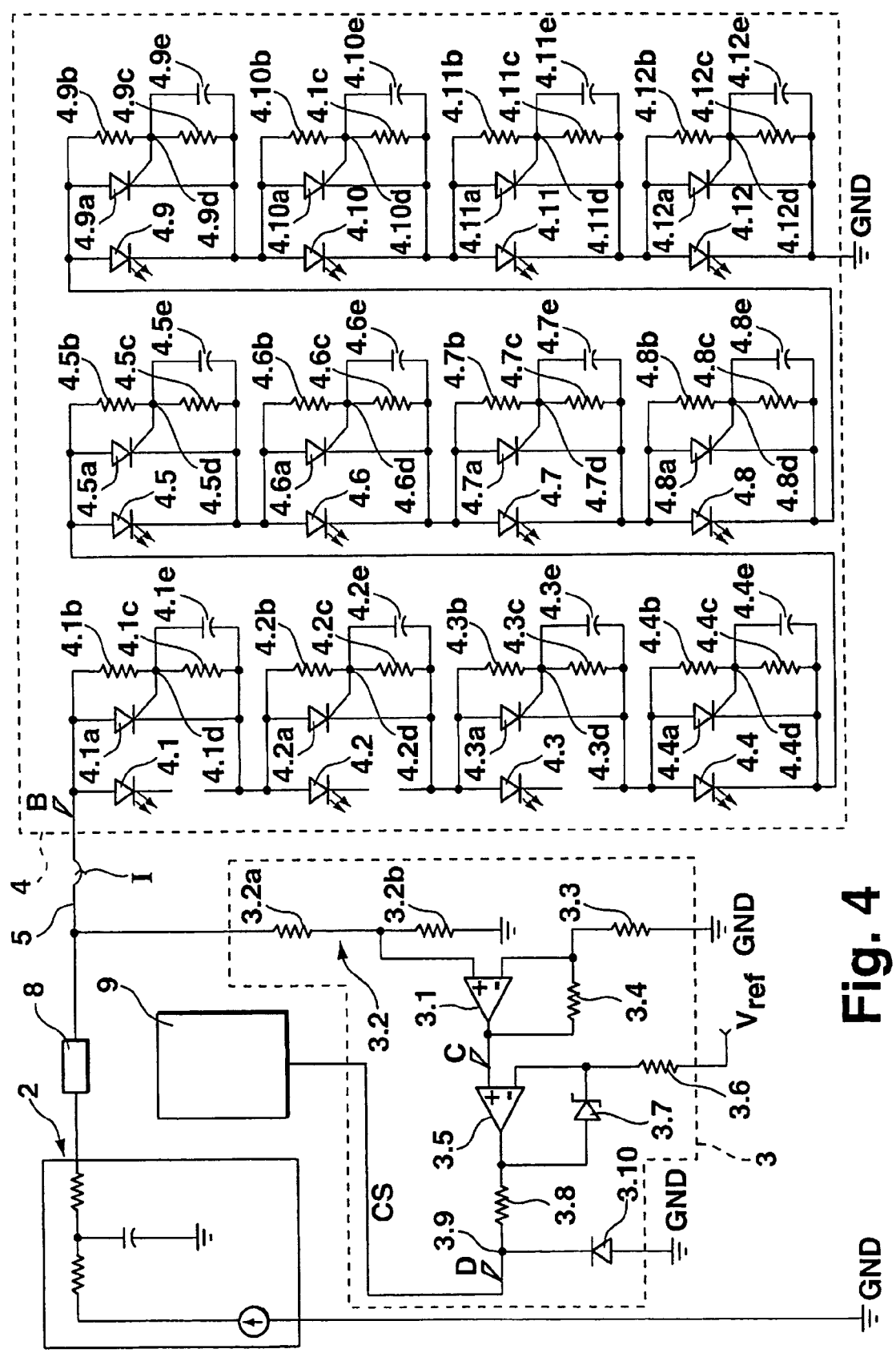
FIG. 4 is a detailed electric circuit diagram of an array of LEDs and a monitoring device in accordance with the present invention, wherein a number of LEDs are disconnected from said array.

FIG. 4 shows a detailed electric circuit diagram of an array 4 of LEDs and a monitoring device in accordance with the present invention, wherein a number of LEDs 4.1, 4.2, 4.3 are disconnected from said array 4. Otherwise the diagram in FIG. 4 corresponds to the above-described diagram in FIG. 2. In such a scenario, for each disconnected LED 4.1, 4.2, 4.3 a short circuit is realised by means of the parallel thyristor 4.1a, 4.2a, 4.3a, respectively, in case of a voltage drop of typically more than 5 V, which can be adjusted by varying the respective first and second resistors 4.1b-4.12b, 4.1c-4.12c. In this way, the thyristors 4.1a-4.12a effectively function as bypass means for a (disconnected) LED 4.1-4.12. The capacitors 4.1e-4.12e prevent firing of the thyristors 4.1a-4.12a in case of possible voltage spikes. Obviously, the respective thyristor 4.1a, 4.2a, 4.3a does not reproduce a "perfect" short circuit due to an internal voltage drop across the thyristor, which amounts to about $U_{THY}$=0.8 V. However, the difference in voltage drop as compared with the voltage drop $U_{LED}$ across an LED 4.1, 4.2, 4.3 (approximatively $U_{LED}-U_{THY}$=1.4 V to 3.2 V per disconnected LED, i.e. for every fired thyristor, depending on the colour of the LED) is sufficient for secure detection by means of the evaluation unit 3. Thus the total voltage across the LED array 4 is reduced as described above with reference to FIG. 2, such that a disconnection failure of more than two LEDs 4.1-4.12 will result in a LOW level binary output signal of the second amplifier 3.5. Again, this signal can be used to disconnect the LED array 4 from the current source 2, thus effectively switching off the inventive signalling device 1 (cf. FIG. 1).

Figure 5:
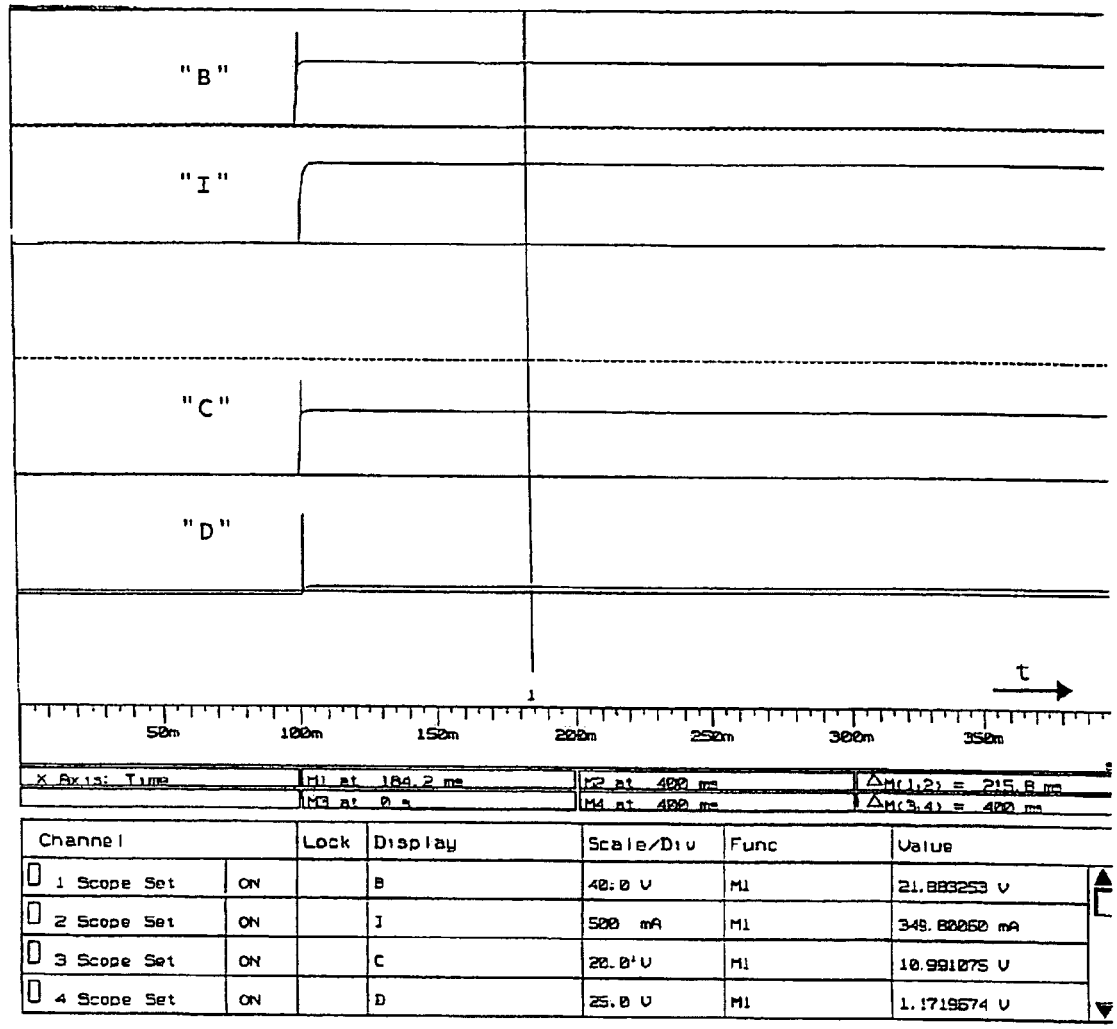
FIG. 5 is a diagram showing voltage and current values measured at different points of the circuit according to FIG. 4.

FIG. 5 shows voltage and current values measured at different points of the circuit according to FIG. 4, i.e. at points denoted B, I, C, and D in FIG. 4, as a function of time t (cf. FIG. 3). When the constant current I (second panel from top in FIG. 5, marked "I") is switched on at t≈100 ms the total voltage $U_T$ across the LED array 4 (topmost panel in FIG. 5, marked "B") first rises steeply due to disconnection of the LEDs 4.1-4.3. Then the associated thyristors 4.1a-4.3a fire, and the total voltage across the array 4 remains stationary at a reduced value (as compared to the situation depicted in FIGS. 2, 3). Correspondingly, this reduction in potential drop across the array 4 results in a reduced output signal of the differential amplifier 3.1 (cf. FIG. 4) as measured at point C (third panel of FIG. 5, marked "C"). Since the value of said output signal now lies below the threshold value defined by the reference voltage $V_{REF}$ the binary output signal of the comparator 3.5 takes the form of a LOW level signal as shown in the last panel of FIG. 5 (marked "D"). This may lead to an opening of the switching means 8 through the control centre, thus disconnecting the LED array 4 from the current source 2 and effectively turning off the signalling device 1 (cf. FIG. 1) according to the present invention.

Thus, the present invention provides electric circuitry which allows an easy and reliable detection of a malfunction of the LED array, e.g. due to failure of individual LEDs because of short circuits and/or disconnection, while ensuring a continued operation of the LED array in case of only minor problems.

The invention claimed is:

1. Monitoring device for monitoring an array of electrical units, in particular an array of high capacity light emitting diodes (LEDs), connected in series and driven by a constant electric current, comprising:

a bypass means for each electrical unit, operable to bypass the respective electrical unit in case of a disconnection of the respective electrical unit, and an evaluation unit connected in parallel with the array of electrical units, said evaluation unit being adapted to determine a total voltage of the array of electrical units and to output a control signal indicative of a function status of the array of electrical units in accordance with a value of the total voltage relative to a predetermined threshold value.

2. Monitoring device according to claim 1, wherein the bypass means comprise a thyristor connected in parallel with the respective electrical unit.

3. Monitoring device according to claim 2, wherein the bypass means comprise a first resistor and a second resistor mutually connected in series and connected in parallel with the thyristor, wherein a node of the first and second resistors is coupled to a gate of the thyristor.

4. Monitoring device according to claim 3, wherein the bypass means comprise a capacitor connected in parallel with the second resistor.

5. Monitoring device according to claim 1, wherein the evaluation unit comprises a differential amplifier adapted to receive as an input voltage the total voltage of the array of electrical units and to generate an output signal indicative of the total voltage of the array of electrical units.

6. Monitoring device according to claim 1, wherein the evaluation unit comprises a comparator adapted to receive an input signal indicative of the total voltage of the array of electrical units at a first input terminal and a reference signal at a second input terminal and to output a binary output signal for use as said control signal.

7. Signalling device, comprising:
an array of lighting units, in particular high capacity light emitting diodes (LEDs), connected in series,
a constant current source coupled to the array of lighting units for driving the lighting units, and
a monitoring device according to claim 1 in operative connection with the array of lighting units for monitoring the array of lighting units.

8. Signalling device according to claim 7, further comprising a monitoring unit for monitoring the function status of the array in dependence of the control signal.

9. Signalling device according to claim 7, further comprising a specific mirror/lens system in operative connection with the array of lighting units.

10. Use of the signalling device according to claim 9 as a railway signalling lamp.

* * * * *